(12) United States Patent
Gupta et al.

(10) Patent No.: US 10,748,583 B2
(45) Date of Patent: Aug. 18, 2020

(54) DUMMY BITLINE CIRCUITRY

(71) Applicant: Arm Limited, Cambridge (GB)

(72) Inventors: Lalit Gupta, Cupertino, CA (US);
Jitendra Dasani, Cupertino, CA (US);
Vivek Nautiyal, Milpitas, CA (US);
Fakhruddin Ali Bohra, Austin, TX
(US); Shri Sagar Dwivedi, San Jose,
CA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/851,341

(22) Filed: Dec. 21, 2017

(65) Prior Publication Data

US 2019/0198064 A1 Jun. 27, 2019

(51) Int. Cl.
*G11C 7/08* (2006.01)
*G11C 7/12* (2006.01)
*G11C 7/22* (2006.01)

(52) U.S. Cl.
CPC .......... *G11C 7/08* (2013.01); *G11C 7/12* (2013.01); *G11C 7/227* (2013.01)

(58) Field of Classification Search
CPC ............. G11C 7/08; G11C 7/12; G11C 7/227
USPC ....................................................... 365/210.1
See application file for complete search history.

(56) References Cited

U.S. PATENT DOCUMENTS

| | | | | |
|---|---|---|---|---|
| 6,301,176 B1 * | 10/2001 | Brown | ...................... | G11C 7/12 365/190 |
| 9,251,912 B2 * | 2/2016 | Lee | ...................... | G11C 29/006 |
| 9,858,217 B1 * | 1/2018 | Marfatia | ................ | G06F 1/3225 |
| 9,928,889 B1 * | 3/2018 | Narasimhan | ............. | G11C 7/12 |
| 2002/0048198 A1 * | 4/2002 | Terzioglu | .................. | G11C 7/06 365/194 |
| 2004/0141395 A1 * | 7/2004 | Ohtsuki | ............... | G11C 7/1045 365/210.1 |
| 2006/0120175 A1 * | 6/2006 | Chou | ........................ | G11C 7/12 365/189.06 |
| 2008/0175040 A1 * | 7/2008 | Kushida | .................... | G11C 5/02 365/154 |
| 2012/0127784 A1 * | 5/2012 | Tachibana | ................. | G11C 7/08 365/156 |
| 2012/0163110 A1 * | 6/2012 | Sinha | ...................... | G11C 7/227 365/203 |
| 2012/0224405 A1 * | 9/2012 | Tanaka | ..................... | G11C 8/08 365/72 |
| 2015/0155054 A1 * | 6/2015 | Lee | ........................ | G11C 29/006 365/201 |
| 2018/0024758 A1 * | 1/2018 | Wang | ..................... | G06F 3/0619 711/103 |

* cited by examiner

*Primary Examiner* — Sung Il Cho
(74) *Attorney, Agent, or Firm* — Praumudji Law Group PLLC; Ari Pramudji

(57) ABSTRACT

Various implementations described herein are directed to an integrated circuit having first dummy bitline circuitry with a first charge storage element and second dummy bitline circuitry coupled to the first dummy bitline circuitry, and the second dummy bitline circuitry has a second charge storage element. The integrate circuit may include decoupling circuitry coupled to the first dummy bitline circuitry and the second dummy bitline circuitry between the first charge storage element and the second charge storage element. The decoupling circuitry may operate to decouple the second charge storage element from the first charge storage element based on an enable signal.

20 Claims, 7 Drawing Sheets

DUMMY BITLINE CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

To reduce local variation on a self-timing path, multiple active pulldown devices may be used for a dummy bitline (DBL). However, using multiple pulldown devices may cause a faster self-timing path (STP), which may result in problems that modify a sense amplifier differential pulse width and write margin. To assist with fixing those problems, an extra capacitor may be added to the dummy bitline (DBL) to optimize the self-timing path (STP). Unfortunately, using additional capacitors on the dummy bitline (DBL) may result in a DBL precharge component operating similar to a cycle-time component, and hence, overall frequency of an operating clock (CLK) may become slower, and in some situations, the memory may thus operate slower.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to dummy bitline (DBL) circuitry for memory applications. For instance, various implementations are directed to schemes and techniques that optimize dummy bitline (DBL) precharge without impacting access time. As described herein, some implementations refer to a scheme or technique that splits (or decouples from each other) a dummy bitline capacitor (dbl cap) and another dummy bitline capacitor (dbl_extra cap) with use of decoupling circuitry. Further, some implementations refer to a scheme or technique that splits (or decouples from each other) a dummy bitline capacitor (dbl cap) and another dummy bitline capacitor (dbl_extra cap) with use of a transmission gate, which may open when a global timing pulse (gtp) goes high and close when gtp goes low. Hence, the dbl_extra capacitor may start precharging right after the gtp goes low, and when an activation signal (e.g., dwl_turn) fall occurs, the dbl capacitor may be precharged to only half of its charging potential. Still further, some implementations refer to a scheme or technique that utilizes a faster dbl precharge component, wherein the dbl capacitor and the dbl_extra capacitor are shorted, and by disposing the decoupling circuitry after the short, the dummy bitline may be precharged right after the gtp fall. This may result in a faster activation signal (dwl_turn) fall.

Various implementations of dummy bitline (DBL) circuitry will now be described in greater detail herein with reference to FIGS. 1A-5.

Figure 1A:
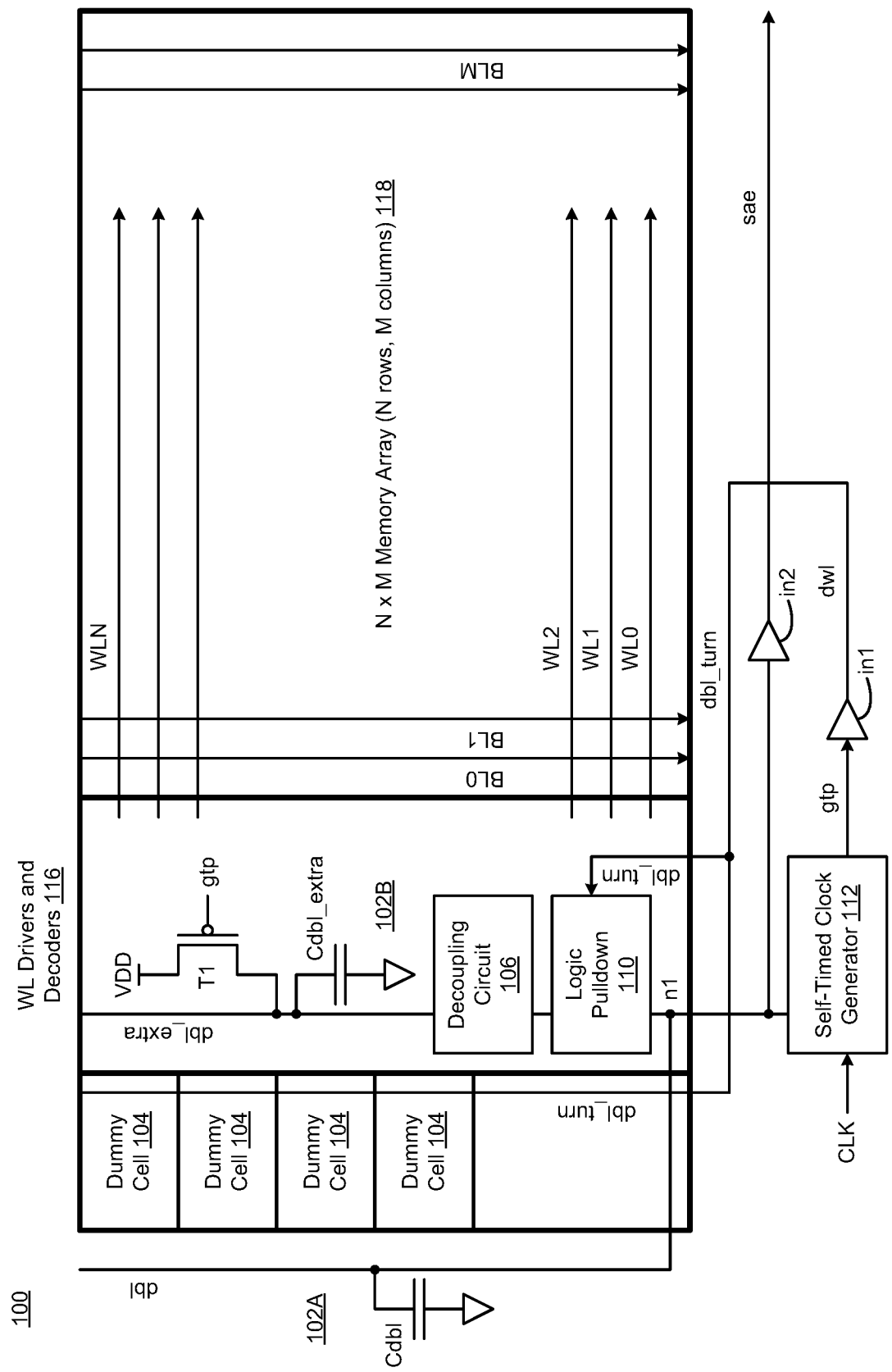
FIG. 1A illustrates a schematic diagram of memory circuitry having dummy bitline (DBL) circuitry in accordance with various implementations described herein.

FIG. 1A illustrates a schematic diagram of memory circuitry 100 with dummy bitline (DBL) circuitry 102A, 102B in accordance with various implementations described herein. The memory circuitry 100 may include an N×M memory array of bitcells 118 that is arranged with N rows and M columns, wherein each bitcell in the array of bitcells 118 is accessible via wordlines WL0, WL1, WL 2, ... WLN and bitlines BL0, BL1, ... BLM. The memory circuitry 100 may include wordline (WL) drivers and decoders 116 that are used to access each of the bitcells in the array of bitcells 118. The memory circuitry 100 may include self-timed clock generator circuitry 112 that may receive a clock signal CLK and provide a global timing signal gtp. The gtp signal is provided to an inverter in1 that inverts the gtp signal and provides a dummy wordline signal dwl. The dwl signal may be referred to as dwl_turn signal, which is provided to one or more dummy bitcells 104 and pulldown logic circuitry 110.

Further, as shown in FIG. 1A, first dummy bitline (DBL) circuitry 102A may include a first charge storage element Cdbl coupled to a first dummy bitline dbl. The first dummy bitline dbl may be coupled to a second dummy bitline dbl_extra at node n1. In addition, second dummy bitline (DBL) circuitry 102B may include second charge storage element Cdbl_extra coupled to the second dummy bitline dbl_extra. The second dummy bitline (DBL) circuitry 102B may include a precharge transistor T1, decoupling circuitry 106, and the logic pulldown circuitry 110 that are coupled to the second dummy bitline dbl_extra. The second dummy bitline (DBL) circuitry 102B may be coupled to the self-timed clock generator circuitry 112, and the second dummy bitline dbl_extra may be used to provide a dbl signal via node n1 to another inverter in2 that inverts the dbl signal and provides a sense amp signal sae to a sense amplifier (not shown).

In some implementations, the dummy bitline (dbl) precharging may be affected by operating improvements with respect to the dummy bitline (DBL) circuitry described herein. For instance, in reference to the decoupling circuitry 106, the dbl precharge happening on the dbl_extra bitline may begin right after the gtp fall, while the dbl prechrage happens after the dwl_turn fall. Hence, these operating instances may improve cycle time of the dummy bitline (DBL) circuitry.

Figure 1B:
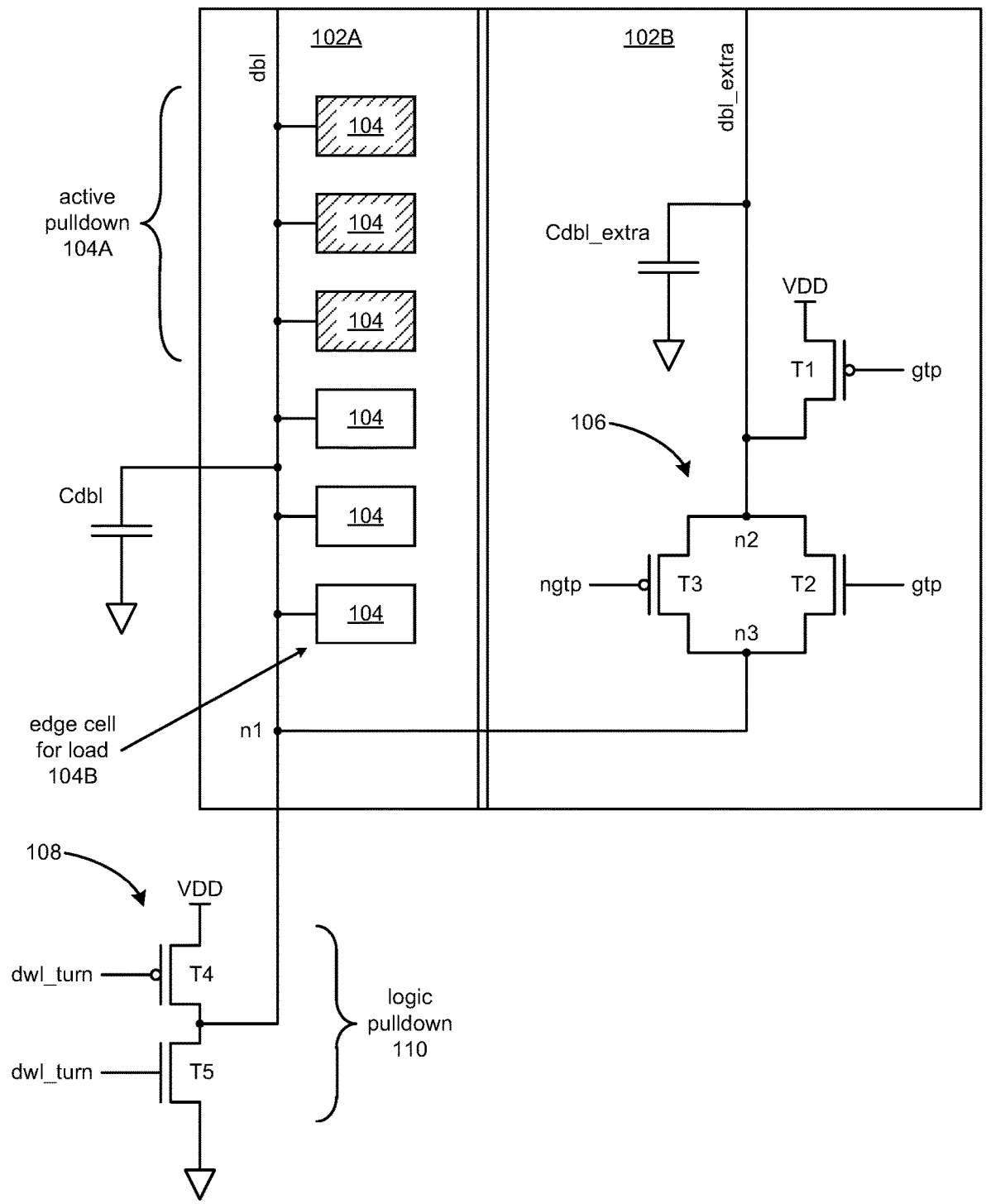
FIG. 1B illustrates a schematic diagram of dummy bitline (DBL) circuitry in accordance with various implementations described herein.
Figure 2:
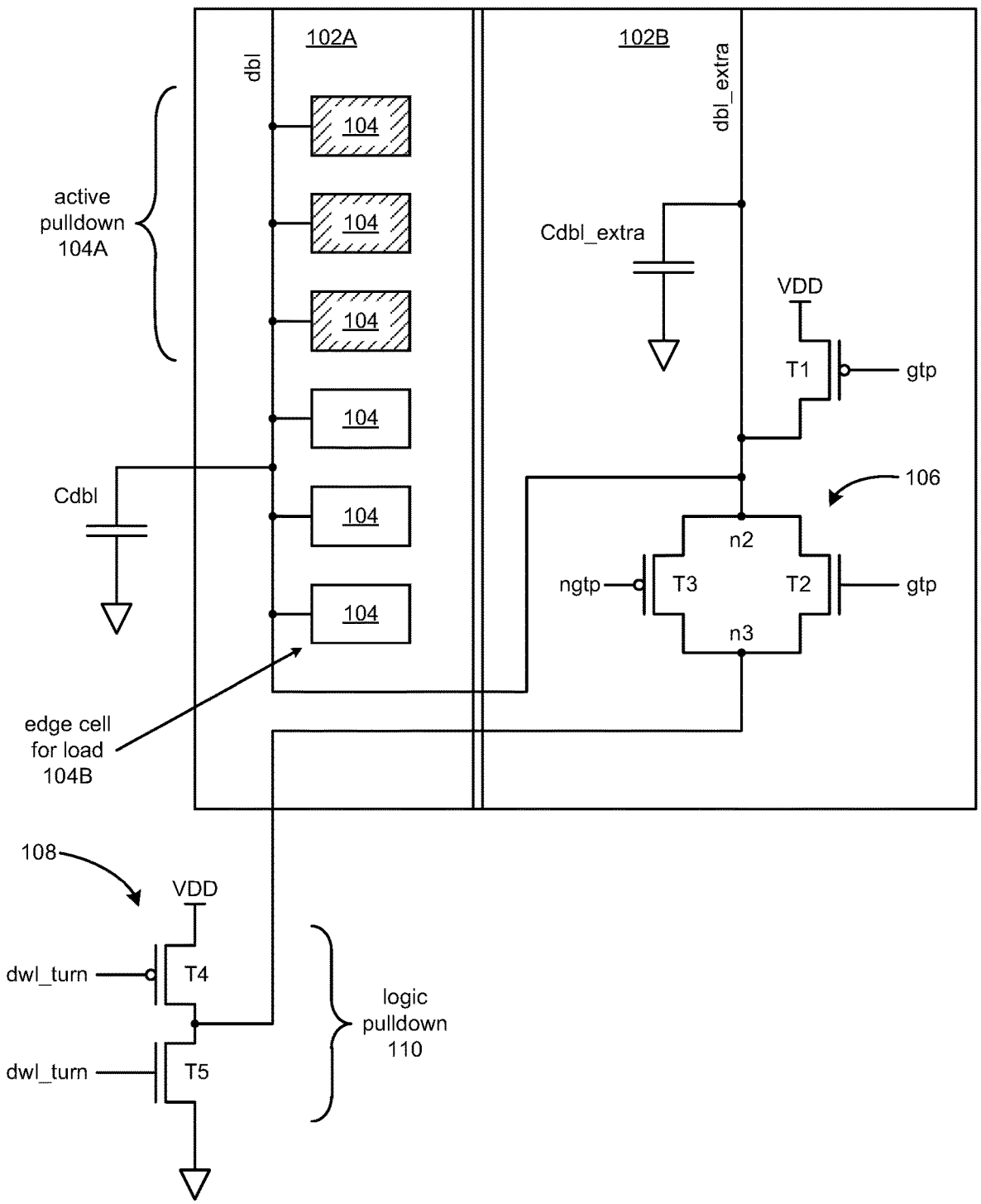
FIG. 2 illustrates a schematic diagram of dummy bitline (DBL) circuitry in accordance with various implementations described herein.

FIGS. 1B-2 illustrate various schematic diagrams of dummy bitline (DBL) circuitry in accordance with various implementations described herein. In particular, FIG. 1B shows a schematic diagram of dummy bitline (DBL) circuitry 120, and FIG. 2 shows a schematic diagram of dummy bitline (DBL) circuitry 200.

As shown in FIG. 1B, the dummy bitline (DBL) circuitry 120 may include the first dummy bitline circuitry 102A having the first charge storage element Cdbl. The dummy bitline (DBL) circuitry 120 may include the first dummy bitline dbl, and the first charge storage element Cdbl may be coupled to the first dummy bitline dbl, e.g., at node n1. In some instances, as shown, the first charge storage element Cdbl may be coupled between the first dummy bitline dbl and ground. Further, the first charge storage element Cdbl may be embodied as a first bitline capacitor.

The dummy bitline (DBL) circuitry 120 may include the second dummy bitline circuitry 102B coupled to the first dummy bitline circuitry 102A, and the second dummy bitline circuitry 102B may include the second charge storage element Cdbl_extra. The dummy bitline (DBL) circuitry 120 may include the second dummy bitline dbl_extra, and the second charge storage element Cdbl_extra may be coupled to the second dummy bitline dbl_extra, e.g., at node n2. In some instances, as shown, the second charge storage element Cdbl_extra may be coupled between the second dummy bitline dbl_extra and ground. Further, the second charge storage element Cdbl_extra may be embodied as a second bitline capacitor.

The dummy bitline (DBL) circuitry 120 may include the decoupling circuitry 106 that is coupled to the first dummy bitline circuitry 102A and the second dummy bitline circuitry 102B between the first charge storage element Cdbl and the second charge storage element Cdbl_extra. The decoupling circuitry 106 may operate to decouple the second charge storage element Cdbl_extra from the first charge storage element Cdbl based on an enable signal, such as, e.g., one or more of gtp and ngtp.

The enable signal may include multiple enable signals including a first enable signal gtp and a second enable signal ngtp that is a complement of the first enable signal gtp. In this instance, the decoupling circuitry 106 may operate to decouple the second charge storage element Cdbl_extra from the first charge storage element Cdbl based on the first enable signal gtp and the second enable signal ngtp.

In some implementations, the precharge transistor T1 may be referred to as a first transistor T1 that is activated based on the first enable signal gtp. The first transistor T1 may be coupled to the second dummy bitline dbl_extra, e.g., at node n2. In addition, the first transistor T1 may be coupled between a source voltage VDD and the second dummy bitline dbl_extra, e.g., at node n2. Further, the first transistor T1 may be a P-type metal-oxide-semiconductor (PMOS) transistor. However, in some scenarios, other types of transistors, such as, e.g., an N-type transistor, may be used.

The decoupling circuitry 106 may include a second transistor T2 that is activated based on the first enable signal gtp. The second transistor T2 may be coupled to the second dummy bitline dbl_extra, e.g., between node n2 and node n3. Node n3 may be the same as node n1. The second transistor T2 may be an N-type MOS (NMOS) transistor. However, in some scenarios, other types of transistors, such as, e.g., a P-type transistor, may be used.

The decoupling circuitry 106 may include a third transistor T3 that is activated based on the second enable signal ngtp that is the complement of the first enable signal gtp. The third transistor T3 may be coupled to the second dummy bitline dbl_extra, e.g., between node n2 and node n3. The third transistor T3 may be a P-type MOS (PMOS) transistor. However, in some scenarios, other types of transistors, such as, e.g., an N-type transistor, may be used.

As shown in FIG. 1B, the second transistor T2 and the third transistor T3 may be coupled together and arranged to operate in parallel as a pass gate pair based on the first enable signal gtp and the second enable signal ngtp, respectively. The second transistor T2 and the third transistor T3 may be disposed between the first transistor T1 and the first dummy bitline circuitry 102A. The pass gate pair of the second transistor T2 and the third transistor T3 may be coupled between the first transistor T1 and the first dummy bitline circuitry 102A.

The dummy bitline (DBL) circuitry 120 may use one or more dummy bitline loads 104 that are coupled to the first dummy bitline circuitry 102A. In some instances, as shown, one or more of the dummy bitline loads 104 may be referred to as active pulldown devices 104A, such as, e.g., as shown with a shaded block. In other instances, as shown, one or more of the dummy bitline loads 104 may be referred to as non-active pulldown devices, such as, e.g., as shown with a white block. Further, at least one of the dummy bitline loads 104 may be referred to as an edge cell for the dummy load 104B.

The dummy bitline (DBL) circuitry 120 may include dummy wordline driver circuitry 108 that is coupled to the first dummy bitline circuitry 102A at node n1 and the second dummy bitline circuitry 102B at node n1. The dummy wordline driver circuitry 108 may be coupled to the multiple dummy bitline loads 104 via the first dummy bitline circuitry 102A at node n1, and the dummy wordline driver circuitry 108 may be coupled to the decoupling circuitry 106 via the second dummy bitline circuitry 102B at node n1.

In some implementations, the dummy wordline driver circuitry 108 may include one or more transistors, such as, e.g., a fourth transistor T4 (PMOS) and a fifth transistor T5 (NMOS) that may be coupled together and arranged to operate in series as an inverter or buffer to drive the first dummy bitline dbl based on an activation signal dwl_turn. In some instances, as shown, the transistors T4, T5 may be referred to as logic pulldown devices as part of the logic pulldown circuitry 110.

As shown in FIG. 2, the dummy bitline (DBL) circuitry 200 represents modified dummy bitline (DBL) circuitry 120 that removes node n1 and re-routes the coupling of the dummy wordline driver circuitry 108 to the first and second dummy bitline circuitry 102A, 102B via the pass gate pair of the second and third transistors T2, T3. As shown, the first dummy bitline circuitry 102A may be coupled to the second dummy bitline circuitry 102B at node n2, and in this instance, the dummy bitline loads 104 may also be coupled to the decoupling circuitry 106 at node n2. Further, the dummy wordline driver circuitry 108 may be coupled to the decoupling circuitry 106 at node n3.

As shown, the node n2 is disposed between the first transistor T1 and the pass gate pair of the second transistor T2 and the third transistor T3. In addition, the dummy wordline driver circuitry 108 may be coupled to the multiple dummy bitline loads 104 via the decoupling circuitry 106 at node n3 and the first dummy bitline circuitry 102A at node n2. Further, the dummy wordline driver circuitry 108 may be coupled to the decoupling circuitry 106 at node n3 via the second dummy bitline circuitry 102B.

Figure 3A:
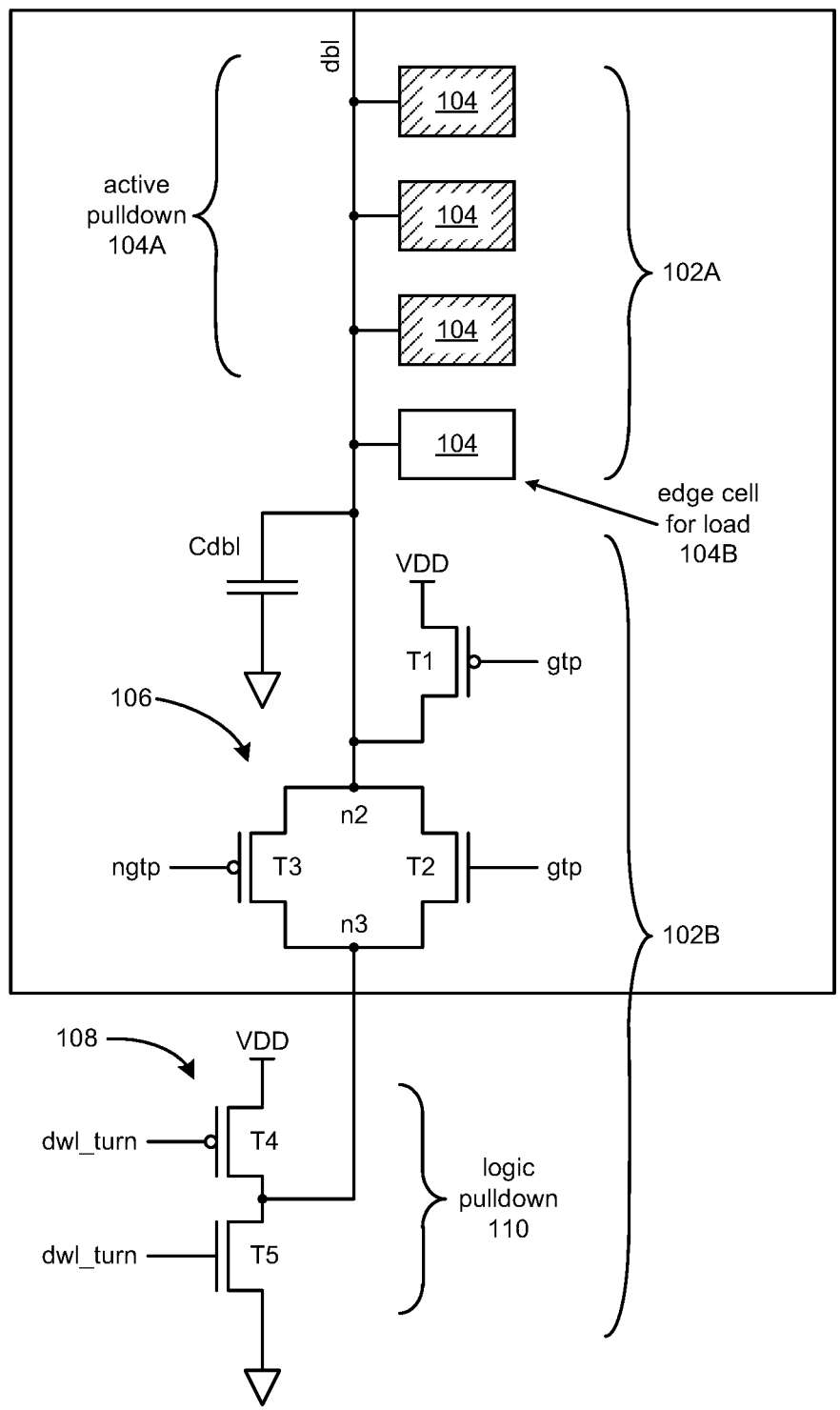
FIGS. 3A-3B illustrate various other schematic diagrams of dummy bitline (DBL) circuitry in accordance with various implementations described herein.
Figure 3B:
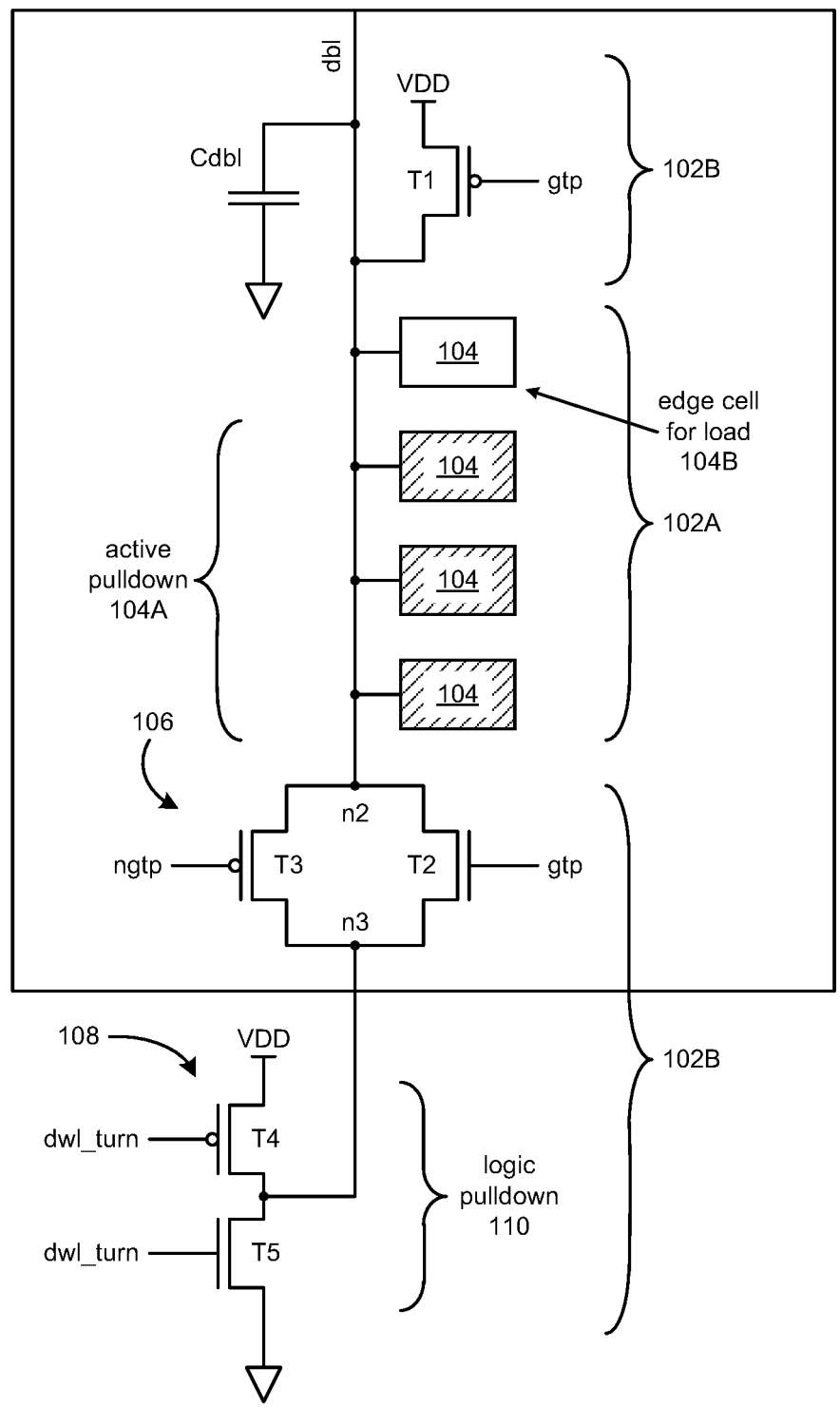

FIGS. 3A-3B illustrate various other schematic diagrams of dummy bitline (DBL) circuitry in accordance with implementations described herein. In particular, FIG. 3A shows a schematic diagram of dummy bitline (DBL) circuitry 300A, and FIG. 3B shows a schematic diagram of dummy bitline (DBL) circuitry 300B.

As shown in FIG. 3A, the dummy bitline (DBL) circuitry 300A may include the first dummy bitline circuitry 102A having the charge storage element Cdbl and the one or more dummy bitline loads 104. In some instances, the charge storage element Cdbl may be embodied as a bitline capacitor.

The dummy bitline (DBL) circuitry 300A may include the second dummy bitline circuitry 102B with the dummy wordline driver circuitry 108. The dummy bitline (DBL) circuitry 300A may include the decoupling circuitry 106, which is coupled between the first dummy bitline circuitry 102A and the second dummy bitline circuitry 102B.

The decoupling circuitry 106 may operate to decouple the charge storage element Cdbl from the second dummy bitline circuitry 102B based on the one or more enable signals gtp, ngtp. In some instances, the decoupling circuitry 106 may operate to decouple the charge storage element Cdbl from the dummy wordline driver circuitry 108 based on the one or more enable signals gtp, ngtp. As described herein, the one or more enable signals may include multiple enable signals including the first enable signal gtp and the second enable signal ngtp that is a complement of the first enable signal gtp. The decoupling circuitry 106 may operate to decouple the charge storage element Cdbl from the second dummy bitline circuitry 102B (and/or the dummy wordline driver circuitry 108) based on the first enable signal gtp and the second enable signal ngtp.

As further shown in FIG. 3A, the first transistor T1 may be activated based on the first enable signal gtp. The decoupling circuitry 106 may include the second transistor T2 that may be activated based on the first enable signal gtp. The decoupling circuitry 106 may also include the third transistor T3 that is activated based on the second enable signal ngtp, which is the complement of the first enable signal gtp. The second transistor T2 and the third transistor T3 may be coupled together and arranged to operate in parallel as a pass gate pair based on the first enable signal gtp and the second enable signal ngtp, respectively.

In some instances, as shown in FIG. 3A, the first transistor T1 may be disposed between the multiple dummy bitline loads 104 and the pass gate pair of the second transistor T2 and the third transistor T3. Further, as shown in FIG. 3A, the first transistor T1 is coupled to the first dummy bitline circuitry 102A between the multiple dummy bitline loads 104 and the pass gate pair of the second transistor T2 and the third transistor T3. In some instances, as shown, one or more of the dummy bitline loads 104 may be referred to as active pulldown devices 104A, such as, e.g., as shown with a shaded block. In other instances, as shown, one or more of the dummy bitline loads 104 may be referred to as non-active pulldown devices, such as, e.g., as shown with a white block. Further, at least one of the dummy bitline loads 104 may be referred to as an edge cell for the dummy load 104B.

In other instances, as shown in FIG. 3B, the multiple dummy bitline loads 104 may be disposed between the first transistor T1 and the pass gate pair of the second transistor T2 and the third transistor T3. Further, as shown in FIG. 3B, the one or more dummy bitline loads 104 are coupled to the first dummy bitline circuitry 102A between the first transistor T1 and the pass gate pair of the second transistor T2 and the third transistor T3. In some instances, as shown, one or more of the dummy bitline loads 104 may be referred to as active pulldown devices 104A, such as, e.g., as shown with a shaded block. In other instances, as shown, one or more of the dummy bitline loads 104 may be referred to as non-active pulldown devices, such as, e.g., as shown with a white block. Further, at least one of the dummy bitline loads 104 may be referred to as an edge cell for the dummy load 104B.

Some advantages achieved with the various implementations described herein may include optimizing the dummy bitline (dbl) precharge cycle-time component without impacting the operating clock (CLK). Another advantage may include providing a generic scheme and/or technique that may be implemented in any configuration. Further, another advantage may include matching the dbl capacitor with the main bitline by decoupling the additional dbl_extra capacitor from the dummy bitline (dbl).

Figure 4:
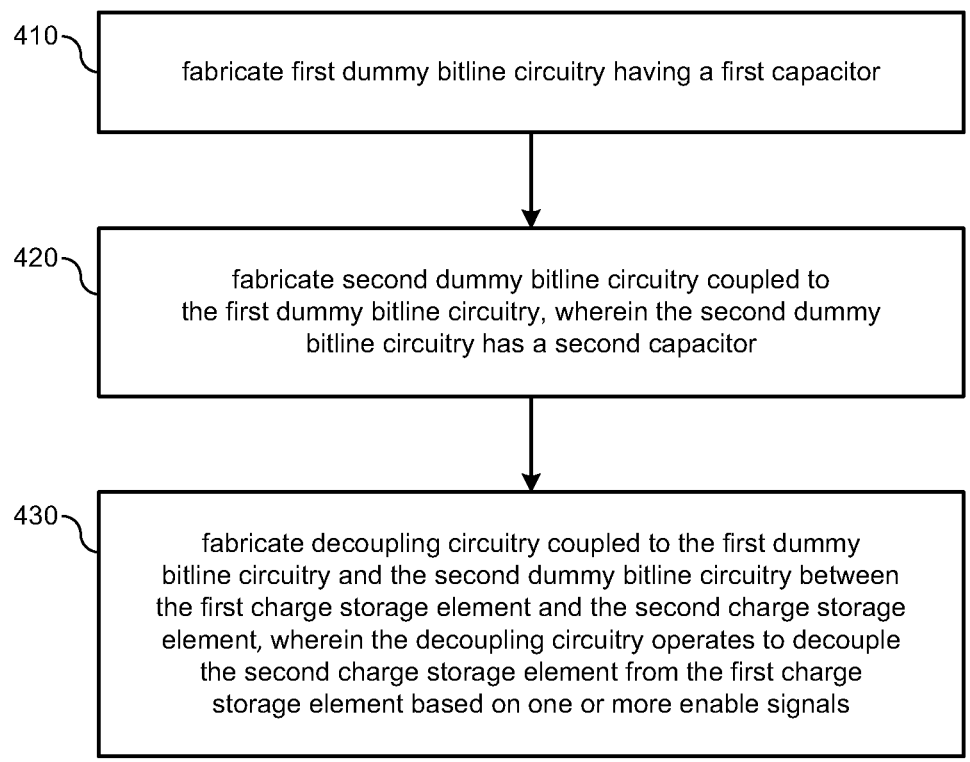
FIG. 4 illustrates a process diagram of a method for fabricating dummy bitline (DBL) circuitry in accordance with implementations described herein.

FIG. 4 illustrates a process flow diagram of a method 400 for fabricating DBL circuitry in accordance with implementations described herein.

It should be understood that even though method 400 may indicate a particular order of operation execution, in some cases, various certain portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various circuit elements, such as described herein above in reference to FIGS. 1A-2. If implemented in software, method 400 may be implemented as a program or software instruction process that may be configured for dummy bitline (DBL) circuitry as described herein. Further, if implemented in software, instructions related to implementing the method 400 may be stored in memory and/or a database. For instance, a computer or various other types of computing devices having a processor and memory may be configured to perform method 400.

As described and shown in reference to FIG. 4, method 400 may be utilized for manufacturing an IC that implements dummy bitline (DBL) circuitry in various types of memory applications. For instance, method 400 may be utilized for manufacturing DBL circuitry for memory applications, wherein the DBL circuitry may be adaptive to pressure, voltage and temperature (PVT).

At block 410, method 400 may fabricate first dummy bitline circuitry having a first charge storage element, such as, e.g., a first bitline capacitor. At block 420, method 400 may fabricate second dummy bitline circuitry coupled to the first dummy bitline circuitry, wherein the second dummy bitline circuitry includes a second charge storage element, such as, e.g., a second bitline capacitor.

At block 430, method 400 may fabricate fabricating decoupling circuitry coupled to the first dummy bitline circuitry and the second dummy bitline circuitry between the first charge storage element (e.g., the first capacitor) and the second charge storage element (e.g., the second capacitor). The decoupling circuitry may operate to decouple the second charge storage element (e.g., the second capacitor) from the first charge storage element (e.g., the first capacitor) based on one or more enable signals.

Figure 5:
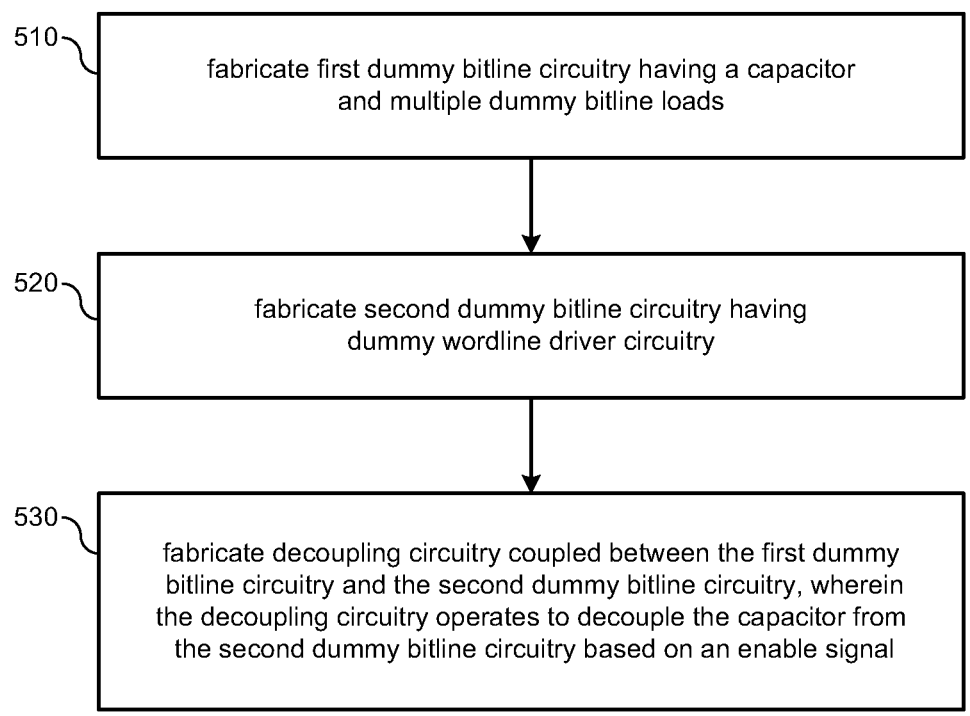
FIG. 5 illustrates a process diagram of another method for fabricating dummy bitline (DBL) circuitry in accordance with implementations described herein.

FIG. 5 illustrates a process flow diagram of another method 500 for fabricating DBL circuitry in accordance with implementations described herein.

It should be understood that even though method 500 may indicate a particular order of operation execution, in some cases, various certain portions of the operations may be executed in a different order, and on different systems. In other cases, additional operations and/or steps may be added to and/or omitted from method 500. Also, method 500 may be implemented in hardware and/or software. If implemented in hardware, the method 500 may be implemented with various circuit elements, such as described herein above in reference to FIGS. 3A-3B. If implemented in software, method 500 may be implemented as a program or software instruction process that may be configured for dummy bitline (DBL) circuitry as described herein. Further, if implemented in software, instructions related to implementing the method 500 may be stored in memory and/or a database. For instance, a computer or various other types of computing devices having a processor and memory may be configured to perform method 500.

As described and shown in reference to FIG. 5, method 500 may be utilized for manufacturing an IC that implements dummy bitline (DBL) circuitry in various types of memory applications. For instance, method 500 may be utilized for manufacturing DBL circuitry for memory applications, wherein the DBL circuitry may be adaptive to pressure, voltage and temperature (PVT).

At block 510, method 500 may fabricate first dummy bitline circuitry having a charge storage element (e.g., a bitline capacitor) and multiple dummy bitline loads. At block 520, method 500 may fabricate second dummy bitline circuitry having dummy wordline driver circuitry.

At block 530, method 500 may fabricate decoupling circuitry coupled between the first dummy bitline circuitry and the second dummy bitline circuitry. The decoupling circuitry may operate to decouple the charge storage element (e.g., the bitline capacitor) from the second dummy bitline circuitry based on one or more enable signals.

Described herein are various implementations of an integrated circuit. The integrated circuit may include first dummy bitline circuitry having a first charge storage element. The integrated circuit may include second dummy bitline circuitry coupled to the first dummy bitline circuitry, and the second dummy bitline circuitry has a second charge storage element. The integrated circuit may include decoupling circuitry coupled to the first dummy bitline circuitry and the second dummy bitline circuitry between the first charge storage element and the second charge storage element. The decoupling circuitry may operate to decouple the second charge storage element from the first charge storage element based on an enable signal.

Described herein are various implementations of an integrated circuit. The integrated circuit may include first dummy bitline circuitry with a charge storage element and multiple dummy bitline loads. The integrated circuit may include second dummy bitline circuitry having dummy wordline driver circuitry. The integrated circuit may include decoupling circuitry coupled between the first dummy bitline circuitry and the second dummy bitline circuitry. The decoupling circuitry may operate to decouple the charge storage element from the second dummy bitline circuitry based on an enable signal.

Described herein are various implementations of a method for manufacturing an integrated circuit. The method may include fabricating first dummy bitline circuitry with a first capacitor. The method may include fabricating second dummy bitline circuitry coupled to the first dummy bitline circuitry, and the second dummy bitline circuitry has a second capacitor. The method may include fabricating decoupling circuitry coupled to the first dummy bitline circuitry and the second dummy bitline circuitry between the first charge storage element and the second charge storage element. The decoupling circuitry may operate to decouple the second charge storage element from the first charge storage element based on one or more enable signals.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   first dummy bitline circuitry having a first charge storage element;
   second dummy bitline circuitry coupled to the first dummy bitline circuitry, wherein the second dummy bitline circuitry has a second charge storage element and a first transistor that is activated based on a first enable signal; and
   decoupling circuitry coupled to the first dummy bitline circuitry and the second dummy bitline circuitry between the first charge storage element and the second charge storage element,
   wherein the decoupling circuitry comprises a plurality of transistors and operates to decouple the second charge storage element from the first charge storage element based on a plurality of enable signals,
   wherein at least one of the plurality of enable signals is the first enable signal, and
   wherein the first transistor is different from each of the plurality of transistors.

2. The integrated circuit of claim 1, wherein the first charge storage element is a first bitline capacitor, and wherein the second charge storage element is a second bitline capacitor.

3. The integrated circuit of claim 1, wherein the plurality of enable signals further comprises a second enable signal that is a complement of the first enable signal, and wherein the decoupling circuitry operates to decouple the second charge storage element from the first charge storage element based on the first enable signal and the second enable signal.

4. The integrated circuit of claim 2, wherein the first dummy bitline circuitry comprises multiple dummy bitline loads connected in series with the first bitline capacitor.

5. The integrated circuit of claim 4, wherein the plurality of transistors of the decoupling circuitry comprises a second transistor that is activated based on the first enable signal, and wherein the plurality of transistors of the decoupling circuitry comprises a third transistor that is activated based on the second enable signal that is the complement of the first enable signal.

6. The integrated circuit of claim 5, wherein the second transistor and the third transistor are coupled together and arranged to operate in parallel as a pass gate pair based on the first enable signal and the second enable signal, respectively.

7. The integrated circuit of claim 6, wherein the first dummy bitline circuitry is coupled between the first transistor and the pass gate pair of the second transistor and the third transistor.

8. The integrated circuit of claim 5, wherein the second transistor and the third transistor are disposed between the first transistor and the first dummy bitline circuitry.

9. The integrated circuit of claim 1, further comprising:
   multiple dummy bitline loads coupled to the first dummy bitline circuitry; and
   dummy wordline driver circuitry coupled to the first dummy bitline circuitry and the second dummy bitline circuitry.

10. The integrated circuit of claim 9, wherein the dummy wordline driver circuitry is coupled to the multiple dummy bitline loads via the first dummy bitline circuitry, and wherein the dummy wordline driver circuitry is coupled to the decoupling circuitry via the second dummy bitline circuitry.

11. The integrated circuit of claim 9, wherein the dummy wordline driver circuitry is coupled to the multiple dummy bitline loads via the first dummy bitline circuitry and the decoupling circuitry, and wherein the dummy wordline driver circuitry is coupled to the decoupling circuitry via the second dummy bitline circuitry.

12. An integrated circuit, comprising:
   first dummy bitline circuitry having a charge storage element and multiple dummy bitline loads;
   second dummy bitline circuitry;
   dummy wordline driver circuitry; and
   decoupling circuitry coupled to the first dummy bitline circuitry and the second dummy bitline circuitry at a first node and coupled to the dummy wordline driver circuitry at a second node, wherein the first node is different from the second node, and
   wherein the decoupling circuitry comprises a plurality of transistors and operates to decouple the charge storage element from the second dummy bitline circuitry based on an enable signal.

13. The integrated circuit of claim 12, wherein the charge storage element is a bitline capacitor.

14. The integrated circuit of claim 12, wherein the enable signal comprises multiple enable signals including a first enable signal and a second enable signal that is a complement of the first enable signal, and wherein the decoupling circuitry operates to decouple the charge storage element from the second dummy bitline circuitry based on the first enable signal and the second enable signal.

15. The integrated circuit of claim 14, wherein the second dummy bitline circuitry comprises a first transistor that is activated based on the first enable signal.

16. The integrated circuit of claim 15, wherein the plurality of transistors of the decoupling circuitry comprises a second transistor that is activated based on the first enable signal, and wherein the plurality of transistors of the decoupling circuitry comprises a third transistor that is activated based on the second enable signal that is the complement of the first enable signal.

17. The integrated circuit of claim 16, wherein the second transistor and the third transistor are coupled together and arranged to operate in parallel as a pass gate pair based on the first enable signal and the second enable signal, respectively.

18. The integrated circuit of claim 17, wherein the first transistor is disposed between the multiple dummy bitline loads and the pass gate pair of the second transistor and the third transistor.

19. The integrated circuit of claim 17, wherein the multiple dummy bitline loads are disposed between the first transistor and the pass gate pair of the second transistor and the third transistor.

20. A method for manufacturing an integrated circuit, the method comprising:
   fabricating first dummy bitline circuitry having a first charge storage element;
   fabricating second dummy bitline circuitry coupled to the first dummy bitline circuitry, wherein the second dummy bitline circuitry has a second charge storage element and a first transistor that is activated based on a first enable signal; and
   fabricating decoupling circuitry coupled to the first dummy bitline circuitry and the second dummy bitline circuitry between the first charge storage element and the second charge storage element, wherein the decoupling circuitry comprises a plurality of transistors and operates to decouple the second charge storage element from the first charge storage element based on a plurality of enable signals, wherein at least one of the plurality of enable signals is the first enable signal, and wherein the first transistor is different from each the plurality of transistors.

* * * * *